United States Patent
Namihisa et al.

(10) Patent No.: US 10,424,345 B1
(45) Date of Patent: Sep. 24, 2019

(54) MISALIGNMENT-TOLERANT FLEXIBLE TYPE ELECTRICAL FEED-THROUGH

(71) Applicant: Western Digital Technologies, Inc., San Jose, CA (US)

(72) Inventors: Miki Namihisa, Fujisawa (JP); Kimihiko Sudo, Yokohama (JP); Takako Hayakawa, Hiratsuka (JP); Yuichi Arai, Kawasaki (JP)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 16/231,499

(22) Filed: Dec. 22, 2018

Related U.S. Application Data

(63) Continuation-in-part of application No. 16/005,648, filed on Jun. 11, 2018.

(60) Provisional application No. 62/735,787, filed on Sep. 24, 2018.

(51) Int. Cl.
*G11B 33/14* (2006.01)
*H05K 5/06* (2006.01)
*G11B 25/04* (2006.01)
*G11B 33/12* (2006.01)

(52) U.S. Cl.
CPC ........ *G11B 33/1466* (2013.01); *G11B 25/043* (2013.01); *G11B 33/122* (2013.01); *H05K 5/069* (2013.01)

(58) Field of Classification Search
None
See application file for complete search history.

(56) References Cited

U.S. PATENT DOCUMENTS

| | | | | |
|---|---|---|---|---|
| 4,571,651 A | * | 2/1986 | Reid | G11B 5/105 29/603.05 |
| 5,454,157 A | * | 10/1995 | Ananth | G11B 33/121 29/467 |
| 5,966,267 A | * | 10/1999 | Hooley | G11B 25/043 360/99.16 |
| 6,016,000 A | | 1/2000 | Moslehi | |
| 6,057,982 A | * | 5/2000 | Kloeppel | G11B 25/043 360/99.25 |
| 6,129,579 A | * | 10/2000 | Cox | G11B 5/4846 360/99.18 |
| 6,168,459 B1 | * | 1/2001 | Cox | G11B 5/4846 360/99.18 |
| 6,970,322 B2 | | 11/2005 | Bernett | |
| 6,989,493 B2 | | 1/2006 | Hipwell, Jr. et al. | |

(Continued)

FOREIGN PATENT DOCUMENTS

| | | | | |
|---|---|---|---|---|
| EP | 0844899 B1 | | 7/2003 | |
| JP | 2009004064 A | * | 1/2009 | G11B 33/1466 |

*Primary Examiner* — William J Klimowicz
(74) *Attorney, Agent, or Firm* — John D. Henkhaus

(57) ABSTRACT

A misalignment-tolerant flexible type electrical feed-through assembly, which is able to tolerate connector misalignment, involves a flexible circuit assembly (FCA) part constructed as a laminate structure of a base insulating layer, a conductor layer, and a cover insulating layer, where the FCA part is wrapped around a plurality of metal parts, where the metal parts are slidable relative to each other. Such a feed-through assembly may be used at an interface between a hermetically-sealed internal environment, such as in a lighter-than-air gas filled data storage device, and the external environment.

21 Claims, 13 Drawing Sheets

(56) References Cited

U.S. PATENT DOCUMENTS

| | | |
|---|---|---|
| 7,019,942 B2 | 3/2006 | Gunderson et al. |
| 7,599,147 B2 * | 10/2009 | Gunderson ............ H05K 5/069 |
| | | 360/97.22 |
| 7,874,846 B2 * | 1/2011 | Gunderson ........... G11B 33/122 |
| | | 174/262 |
| 8,035,923 B2 | 10/2011 | Suzuki et al. |
| 8,098,454 B2 | 1/2012 | Kouno et al. |
| 8,194,348 B2 | 6/2012 | Jacoby et al. |
| 8,487,187 B2 * | 7/2013 | VandenEynden ...... H01B 17/30 |
| | | 174/152 GM |
| 8,593,760 B2 | 11/2013 | McGuire, Jr. |
| 9,490,620 B1 | 11/2016 | Albrecht et al. |
| 9,558,790 B1 | 1/2017 | Onobu et al. |
| 9,721,619 B2 * | 8/2017 | Sudo .................... G11B 25/043 |
| 9,734,874 B1 * | 8/2017 | Choe .................. G11B 33/1466 |
| 10,162,393 B2 * | 12/2018 | Fruge ..................... G06F 1/187 |
| 2004/0057589 A1 | 3/2004 | Pedersen et al. |
| 2004/0228039 A1 * | 11/2004 | Wu ...................... G11B 5/4846 |
| | | 360/264.2 |
| 2006/0050429 A1 * | 3/2006 | Gunderson .......... G11B 25/043 |
| | | 360/99.21 |
| 2008/0144273 A1 * | 6/2008 | Mewes ................ G11B 33/121 |
| | | 361/679.37 |
| 2008/0316641 A1 * | 12/2008 | Gunderson ........ G11B 33/1466 |
| | | 360/97.22 |
| 2011/0211279 A1 * | 9/2011 | Jacoby ................ G11B 25/043 |
| | | 360/99.21 |
| 2015/0139770 A1 | 5/2015 | Moura et al. |
| 2017/0294737 A1 * | 10/2017 | Horchler ............. H01R 12/716 |
| 2019/0074615 A1 * | 3/2019 | Okamoto ............... G11B 23/00 |

* cited by examiner

```
┌─────────────────────────────────────────────────────────────────┐
│  FORM A LAMINATE FLEXIBLE CABLE ASSEMBLY (FCA) COMPRISING A BASE│
│  INSULATING LAYER, A CONDUCTOR LAYER OVER THE INSULATING LAYER, │
│  AND A COVER INSULATING LAYER OVER THE CONDUCTOR LAYER, WHEREIN │
│  THE CONDUCTOR LAYER COMPRISES A PLURALITY OF ELECTRICAL        │
│  CONNECTION PADS AND ELECTRICAL CONDUCTORS CONNECTING PAIRS     │
│  OF THE PADS                                                    │
│                              1202                               │
└─────────────────────────────────────────────────────────────────┘
                                │
                                ▼
┌─────────────────────────────────────────────────────────────────┐
│         FOLD THE FCA AT LEAST IN PART AROUND A METAL PLATE      │
│                              1204                               │
└─────────────────────────────────────────────────────────────────┘
                                │
                                ▼
┌─────────────────────────────────────────────────────────────────┐
│  ADHERE THE FCA TO THE METAL PLATE, FORMING A CONNECTOR ASSEMBLY│
│  COMPRISING FIRST PADS OF THE PAIRS ON AN UPPER SIDE OF THE     │
│  CONNECTOR ASSEMBLY ELECTRICALLY CONNECTED VIA THE CONDUCTORS   │
│  TO SECOND PADS OF THE PAIRS ON THE LOWER SIDE OF THE CONNECTOR │
│  ASSEMBLY                                                       │
│                              1206                               │
└─────────────────────────────────────────────────────────────────┘
```

FIG. 12

```
┌─────────────────────────────────────────────────────────────────┐
│  PROVIDE ELECTRICAL TRANSMISSION MEANS FOR TRANSMITTING         │
│  ELECTRICAL SIGNALS THROUGH AN INTERFACE BETWEEN A              │
│  HERMETICALLY-SEALED INTERNAL ENVIRONMENT OF AN ELECTRONIC      │
│  COMPONENT AND AN EXTERNAL ENVIRONMENT                          │
│                              1302                               │
└─────────────────────────────────────────────────────────────────┘
                                │
                                ▼
┌─────────────────────────────────────────────────────────────────┐
│     PROVIDE MEANS FOR MATING A METAL PORTION OF THE ELECTRICAL  │
│     TRANSMISSION MEANS WITH A METAL PORTION OF A BASE OF THE    │
│                     ELECTRONIC COMPONENT                        │
│                              1304                               │
└─────────────────────────────────────────────────────────────────┘
                                │
                                ▼
┌─────────────────────────────────────────────────────────────────┐
│  PROVIDE HERMETICALLY-SEALING MEANS FOR BONDING THE METAL       │
│  PORTION OF THE ELECTRICAL TRANSMISSION MEANS WITH THE METAL    │
│  PORTION OF THE BASE                                            │
│                              1306                               │
└─────────────────────────────────────────────────────────────────┘
```

FIG. 13

MISALIGNMENT-TOLERANT FLEXIBLE TYPE ELECTRICAL FEED-THROUGH

CROSS-REFERENCE TO RELATED APPLICATIONS

This application is a continuation-in-part of and claims the benefit of priority to pending U.S. patent application Ser. No. 16/005,648 filed on Jun. 11, 2018, entitled "Flexible Type Electrical Feed-Through", the entire content of which is incorporated by reference for all purposes as if fully set forth herein.

This application claims the benefit of priority to U.S. Provisional Patent Application Ser. No. 62/735,787, entitled "Flexible Sealed Connector" filed Sep. 24, 2018, the entire content of which is incorporated by reference for all purposes as if fully set forth herein.

FIELD OF EMBODIMENTS

Embodiments of the invention may relate generally to a hermetically sealed data storage device and particularly to controlling gas leakage through an electrical feed-through connector assembly.

BACKGROUND

A hard disk drive (HDD) is a non-volatile storage device that is housed in a protective enclosure and stores digitally encoded data on one or more circular disks having magnetic surfaces. When an HDD is in operation, each magnetic-recording disk is rapidly rotated by a spindle system. Data is read from and written to a magnetic-recording disk using a read-write head that is positioned over a specific location of a disk by an actuator. A read-write head makes use of magnetic fields to write data to and read data from the surface of a magnetic-recording disk. A write head works by using the current flowing through its coil to produce a magnetic field. Electrical pulses are sent to the write head, with different patterns of positive and negative currents. The current n the coil of the write head produces a localized magnetic field across the gap between the head and the magnetic disk, which in turn magnetizes a small area on the recording medium.

HDDs are being manufactured which are hermetically sealed with helium inside. Further, other gases that are lighter than air have been contemplated for use as a replacement for air in sealed HDDs. There are various benefits to sealing and operating an HDD in helium ambient, for example, because the density of helium is one-seventh that of air. Hence, operating an HDD in helium reduces the drag force acting on the spinning disk stack, and the mechanical power used by the disk spindle motor is substantially reduced. Further, operating in helium reduces the flutter of the disks and the suspension, allowing for disks to be placed closer together and increasing the areal density (a measure of the quantity of information bits that can be stored on a given area of disk surface) by enabling a smaller, narrower data track pitch. The lower shear forces and more efficient thermal conduction of helium also mean the HDD will run cooler and will emit less acoustic noise. The reliability of the HDD is also increased due to low humidity, less sensitivity to altitude and external pressure variations, and the absence of corrosive gases or contaminants.

Electronic systems that require hermetically sealed internal volume (e.g., a lighter-than-air gas filled, sealed HDD or system of HDDs) need a way of connecting electrical lines through the enclosure. This is typically accomplished with a hermetic electrical connector, or electrical "feed-through". One possible approach may involve the use of a low permeability but relatively expensive feed-through, such as glass-metal feed-through. Another approach may involve the use of a low-cost printed circuit board (PCB) feed-through, but these typically have a higher leak rate.

Any approaches described in this section are approaches that could be pursued, but not necessarily approaches that have been previously conceived or pursued. Therefore, unless otherwise indicated, it should not be assumed that any of the approaches described in this section qualify as prior art merely by virtue of their inclusion in this section.

BRIEF DESCRIPTION OF THE DRAWINGS

Embodiments are illustrated by way of example, and not by way of limitation, in the figures of the accompanying drawings and in which like reference numerals refer to similar elements and in which:

FIG. 12 is a flow diagram illustrating a method of manufacturing an electrical feed-through component, according to an embodiment;

FIG. 13 is a flow diagram illustrating a method of sealing an interface between a hermetically-sealed internal environment and an external environment, according to an embodiment;

DETAILED DESCRIPTION

Approaches to a sealed electrical feed-through connector assembly are described. In the following description, for the purposes of explanation, numerous specific details are set forth in order to provide a thorough understanding of the embodiments of the invention described herein. It will be apparent, however, that the embodiments of the invention described herein may be practiced without these specific details. In other instances, well-known structures and devices are shown in block diagram form in order to avoid unnecessarily obscuring the embodiments of the invention described herein.

Physical Description of an Illustrative Operating Context

Embodiments may be used in the context of an electrical feed-through for a digital storage device (DSD), such as a hard disk drive (HDD), and in the context of a system of multiple DSDs/HDDs. Thus, in accordance with an embodiment, a plan view illustrating an HDD 100 is shown in FIG. 1 to illustrate an exemplary operating context.

Figure 1:
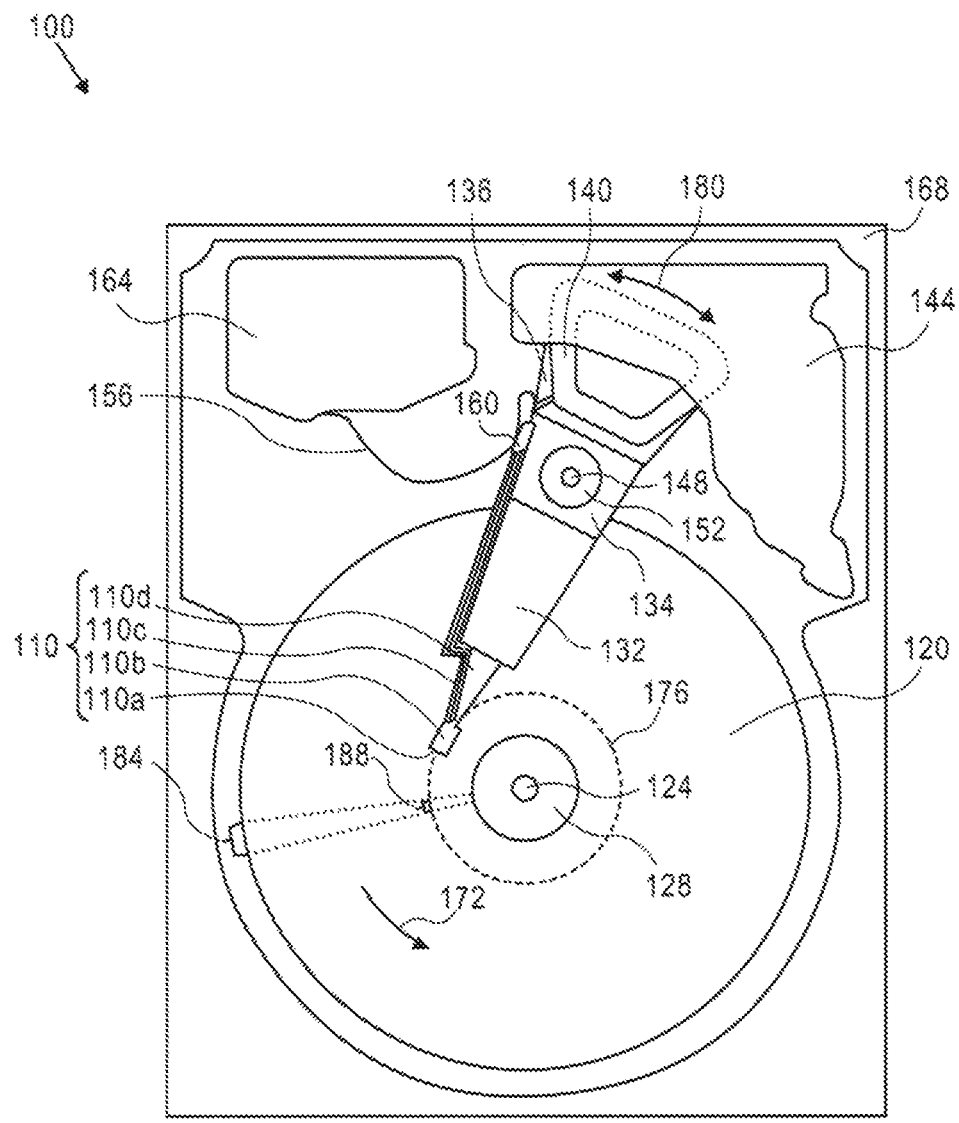
FIG. 1 is a plan view illustrating a hard disk drive (HDD), according to an embodiment.

FIG. 1 illustrates the functional arrangement of components of the HDD 100 including a slider 110b that includes a magnetic read-write head 110a. Collectively, slider 110b and head 110a may be referred to as a head slider. The HDD 100 includes at least one head gimbal assembly (HGA) 110 including the head slider, a lead suspension 110c attached to the head slider typically via a flexure, and a load beam 110d attached to the lead suspension 110c. The HDD 100 also includes at least one recording medium 120 rotatably mounted on a spindle 124 and a drive motor (not visible) attached to the spindle 124 for rotating the medium 120. The read-write head 110a, which may also be referred to as a transducer, includes a write element and a read element for respectively writing and reading information stored on the medium 120 of the HDD 100. The medium 120 or a plurality of disk media may be affixed to the spindle 124 with a disk clamp 128.

The HDD 100 further includes an arm 132 attached to the HGA 110, a carriage 134, a voice-coil motor (VCM) that includes an armature 136 including a voice coil 140 attached to the carriage 134 and a stator 144 including a voice-coil magnet (not visible). The armature 136 of the VCM is attached to the carriage 134 and is configured to move the arm 132 and the HGA 110 to access portions of the medium 120, all collectively mounted on a pivot shaft 148 with an interposed pivot bearing assembly 152. In the case of an HDD having multiple disks, the carriage 134 may be referred to as an "E-block," or comb, because the carriage is arranged to carry a ganged array of arms that gives it the appearance of a comb.

An assembly comprising a head gimbal assembly (e.g., HGA 110) including a flexure to which the head slider is coupled, an actuator arm (e.g., arm 132) and/or load beam to which the flexure is coupled, and an actuator (e.g., the VCM) to which the actuator arm is coupled, may be collectively referred to as a head stack assembly (HSA). An HSA may, however, include more or fewer components than those described. For example, an HSA may refer to an assembly that further includes electrical interconnection components. Generally, an HSA is the assembly configured to move the head slider to access portions of the medium 120 for read and write operations.

With further reference to FIG. 1, electrical signals (e.g., current to the voice coil 140 of the VCM, and a write signal to and a read signal from the head 110a) are transmitted by a flexible cable assembly (FCA) 156 (or "flex cable"), also at times referred to as a flexible printed circuit (FPC). Interconnection between the flex cable 156 and the head 110a may include an arm-electronics (AE) module 160, which may have an on-board pre-amplifier for the read signal, as well as other read-channel and write-channel electronic components. The AE module 160 may be attached to the carriage 134 as shown. The flex cable 156 may be coupled to an electrical-connector block 164, which provides electrical communication, in some configurations, through an electrical feed-through provided by an HDD housing 168. The HDD housing 168 (or "enclosure base" or "baseplate" or simply "base"), in conjunction with an HDD cover, provides a semi-sealed (or hermetically sealed, in some configurations) protective enclosure for the information storage components of the HDD 100.

Other electronic components, including a disk controller and servo electronics including a digital-signal processor (DSP), provide electrical signals to the drive motor, the voice coil 140 of the VCM and the head 110a of the HGA 110. The electrical signal provided to the drive motor enables the drive motor to spin providing a torque to the spindle 124 which is in turn transmitted to the medium 120 that is affixed to the spindle 124. As a result, the medium 120 spins in a direction 172. The spinning medium 120 creates a cushion of air that acts as an air-bearing on which the air-bearing surface (ABS) of the slider 110b rides so that the slider 110b flies above the surface of the medium 120 without making contact with a thin magnetic-recording layer in which information is recorded. Similarly in an HDD in which a lighter-than-air gas is utilized, such as helium for a non-limiting example, the spinning medium 120 creates a cushion of gas that acts as a gas or fluid bearing on which the slider 110b rides.

The electrical signal provided to the voice coil 140 of the VCM enables the head 110a of the HGA 110 to access a track 176 on which information is recorded. Thus, the armature 136 of the VCM swings through an arc 180, which enables the head 110a of the HGA 110 to access various tracks on the medium 120. Information is stored on the medium 120 in a plurality of radially nested tracks arranged in sectors on the medium 120, such as sector 184. Correspondingly, each track is composed of a plurality of sectored track portions (or "track sector") such as sectored track portion 188. Each sectored track portion 188 may include recorded information, and a header containing error correction code information and a servo-burst-signal pattern, such as an ABCD-servo-burst-signal pattern, which is information that identifies the track 176. In accessing the track 176, the read element of the head 110*a* of the HGA 110 reads the servo-burst-signal pattern, which provides a position-error-signal (PES) to the servo electronics, which controls the electrical signal provided to the voice coil 140 of the VCM, thereby enabling the head 110*a* to follow the track 176. Upon finding the track 176 and identifying a particular sectored track portion 188, the head 110*a* either reads information from the track 176 or writes information to the track 176 depending on instructions received by the disk controller from an external agent, for example, a microprocessor of a computer system.

An HDD's electronic architecture comprises numerous electronic components for performing their respective functions for operation of an HDD, such as a hard disk controller ("HDC"), an interface controller, an arm electronics module, a data channel, a motor driver, a servo processor, buffer memory, etc. Two or more of such components may be combined on a single integrated circuit board referred to as a "system on a chip" ("SOC"). Several, if not all, of such electronic components are typically arranged on a printed circuit board that is coupled to the bottom side of an HDD, such as to HDD housing 168.

References herein to a hard disk drive, such as HDD 100 illustrated and described in reference to FIG. 1, may encompass an information storage device that is at times referred to as a "hybrid drive". A hybrid drive refers generally to a storage device having functionality of both a traditional HDD (see, e.g., HDD 100) combined with solid-state storage device (SSD) using non-volatile memory, such as flash or other solid-state (e.g., integrated circuits) memory, which is electrically erasable and programmable. As operation, management and control of the different types of storage media typically differ, the solid-state portion of a hybrid drive may include its own corresponding controller functionality, which may be integrated into a single controller along with the HDD functionality. A hybrid drive may be architected and configured to operate and to utilize the solid-state portion in a number of ways, such as, for non-limiting examples, by using the solid-state memory as cache memory, for storing frequently-accessed data, for storing I/O intensive data, and the like. Further, a hybrid drive may be architected and configured essentially as two storage devices in a single enclosure, i.e., a traditional HDD and an SSD, with either one or multiple interfaces for host connection.

Introduction

The term "hermetic" will be understood to describe a sealing arrangement designed to have nominally no (or negligible) gaseous leakage or permeation paths. While terms such as "hermetic", "hermetically-sealed", "negligible leakage", "no leakage", etc. may be used herein, note that such a system would often still have a certain amount of permeability and, therefore, not be absolutely leak-free. Hence, the concept of a desired or target "leak rate" may be used herein.

The term "substantially" will be understood to describe a feature that is largely or nearly structured, configured, dimensioned, etc., but with which manufacturing tolerances and the like may in practice result in a situation in which the structure, configuration, dimension, etc. is not always or necessarily precisely as stated. For example, describing a structure as "substantially vertical" would assign that term its plain meaning, such that the sidewall is vertical for all practical purposes but may not be precisely at 90 degrees.

Figure 2:
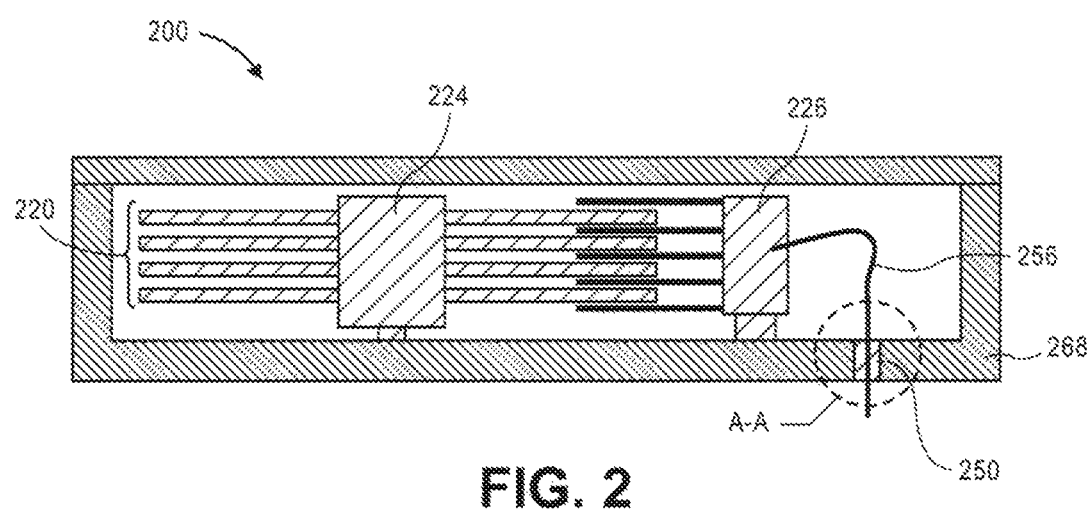
FIG. 2 is a cross-sectional side view illustrating a hard disk drive (HDD), according to an embodiment.

Recall that electronic systems that require hermetically sealed internal volume (e.g., a lighter-than-air gas filled, sealed HDD or system of HDDs) need a way of connecting electrical lines through the sealed enclosure, with one approach utilizing a hermetic electrical connector or electrical "feed-through" (generally, "sealed connector"). FIG. 2 is a cross-sectional side view illustrating a hard disk drive (HDD), according to an embodiment. For example, HDD 200 comprises at least one recording medium 220 (e.g., such as magnetic-recording medium 120 of FIG. 1) rotatably mounted on a spindle 224 (e.g., such as spindle 124 of FIG. 1) of a drive motor that drives the rotation of the recording medium 220, and a head stack assembly (HSA) 226 that carries and moves a head slider housing a read-write transducer to locations over the recording medium 220 for reading information from and writing information to the recording medium 220. HDD 200 further comprises a flexible cable assembly (FCA) 256 that electrically connects the HSA 226 to an electronic component external to the hermetically-sealed internal environment of HDD 200, such as to a printed circuit board (e.g., an "SOC", or system-on-a-chip) that may be coupled to the HDD 200. In so doing, the FCA 256 is routed through an interface 250 (e.g., mechanical and/or electrical), which includes a small opening, which is associated with an HDD enclosure base 268 (e.g., similar to a hermetically-sealed version of HDD housing 168 of FIG. 1). FIG. 2 further illustrates an area A-A near and including the interface 250, which may be referenced elsewhere herein.

The next generations of HDDs are being developed with larger and larger data capacities and, therefore, accelerated data transfer rates is a related developmental goal. Consequently, this could lead to the development of higher performance and multi-functional preamps and/or actuators. Achieving suitable electrical connectivity needed for these expected developments, while maintaining a low cost of a sealed connector, poses a challenge. Also, challenges will likely remain regarding the tradeoffs associated with a low leakage rate versus the cost of a suitable sealed connector.

For example, in order to meet the requirements of a sealed connector for next generation HDDs, it may be beneficial to increase the bonding force between the HDD enclosure base and the sealed connector and to improve the sealing performance. For another example, in order to continue improving the electrical transmission performance, impedance matching may be employed to reduce the capacitance component induced by metal layers associated with certain types of sealed connectors. That is, the space between overlapping metal layers within a sealed connector may be characterized as a "capacitance area" because the two conductive layers act as a capacitor, with the corresponding capacitance being proportional to the surface area of the conductive "plates" and inversely proportional to their distance apart. It is known that parasitic capacitance (e.g., an unavoidable and usually undesirable capacitance between parts of a circuit) can have a significantly deleterious and therefore unwanted effect on high frequency circuits and the high frequency signals transmitting therethrough. Generally, a high-frequency signal in the context of embodiments described herein is a signal having a frequency greater than several hundreds of megahertz, in order to achieve the data rate(s) specified in relevant interface protocols (e.g., SAS, SATA) for example. Further, a high-frequency signal transmission line is in contrast with, for example, power lines, ground lines, control lines, and the like. For another example, due to the aforementioned high performance and multi-functionalization of the preamp and/or actuator, increasing the number of sealed connector pins may be necessary, which could result in a larger sealed connector which would need more mounting space within the enclosure base.

Furthermore, increasing hard disk drive (HDD) capacity is an ever-present design goal. Increasing capacity with the same performance (as may be characterized by TOPS (I/O per second)) is one of the important design requirements. One solution to improve IOPS is to use multiple actuators, such as in a dual-actuator HDD. The dual-actuator HDD has two actuators so the number of signals needed may essentially double. In the context of a sealed HDD, a sealed feed-through connector is needed to support those signals. Glass feed-through and the printed circuit board assembly (PCBA) type sealed connectors would need to have an increased number of electrical contacts to adapt to an HDD with multiple actuators. Thus, a larger connector area is required, which may cause a higher helium leak rate than is desirable. Use of a flexible type electrical feed-through connector ("flex connector"), such as described elsewhere herein, can improve this issue due to a smaller size Board-to-Board (BTB) connector. However, for lighter-than-air gas sealed HDDs, an increase in the number of signal lines makes the flex connector size larger and the leak rate may worsen due to an increased sealing area.

Still further, BTB connectors are not tolerant of structural misalignment between connectors (plug and receptacle) where, in the context of an HDD, one side of the connector is on the PCBA and the other side of the connector is attached to the base by way of a feed-through connector. Thus, higher mounting accuracy and higher machining accuracy may be needed for mating connectors. One approach to handling misalignment may be to use a compression type connector (P2 connector), which does not require high accuracy, instead of a BTB connector. However, the compression type connector needs a larger space due to larger pad size. Because the larger pad for the compression type connector is detrimental to the signal quality, it may be preferable to use a flex connector having one or more (possibly smaller) BTB connectors while absorbing any misalignment associated therewith.

A previous approach to a flex type sealed connector ("flex connector", as described in U.S. patent application Ser. No. 16/005,648 entitled "Flexible Type Electrical Feed-Through") comprises an electrical flexible cable, a metal plate, and the connectors, whereby the flexible cable is completely fixed to the metal plate by adhesive and the connectors are mounted on the flexible cable, according to an embodiment. The flex connector is attached to the base in a sealed manner. The sub-parts of the flex connector are relatively rigidly fixed among each other and require high accuracy positioning for connector mating. When the relative positioning of the connector and the flex cable are fixed with low accuracy, the connector on the flex connector and the connector on the PCBA may not be able to mate or the connectors may experience significant stress. Approaches to this challenge are disclosed herein.

Flexible Type Electrical Feed-Through

Figure 3A:
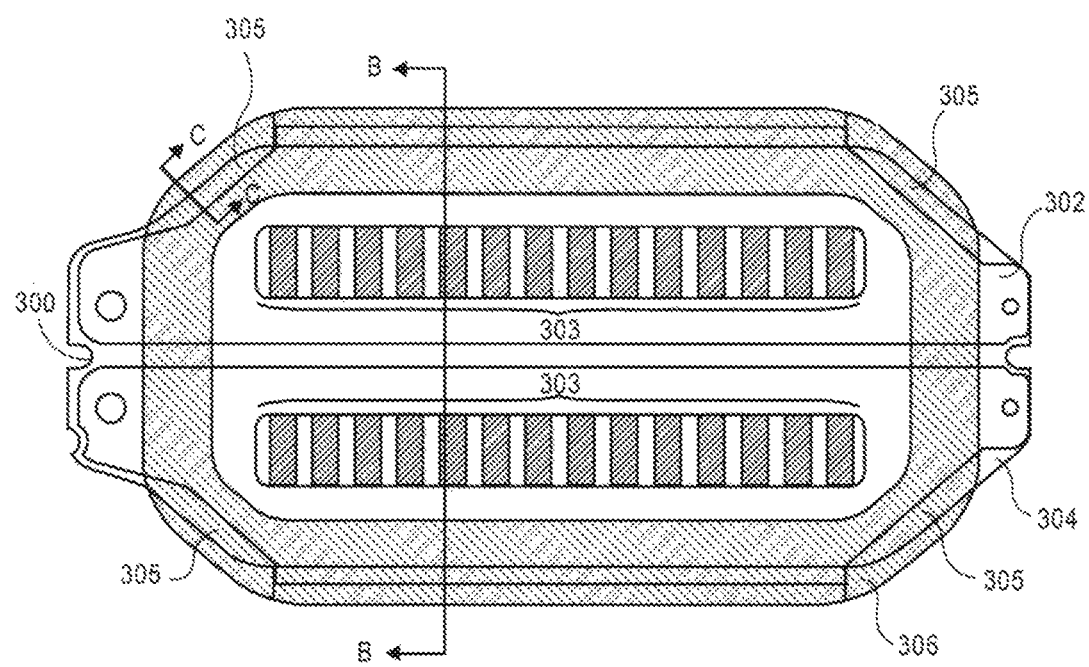
FIG. 3A is a plan view illustrating a flexible type electrical feed-through assembly, according to an embodiment.

FIG. 3A is a plan view illustrating a flexible type electrical feed-through assembly, according to an embodiment. Flexible type (or "flex-type") electrical feed-through assembly ("feed-through") 300 may be utilized as a sealed electrical connector (also referred to simply as a "flex connector"), such as for providing electrical transmission through an interface of a sealed internal environment (such as within a hermetically-sealed electronic component, for a non-limiting example, a sealed hard disk drive data storage device) and an external (e.g., ambient) environment.

Feed-through 300 comprises a flexible circuit assembly (FCA) 302 (or "a flexible printed circuit (FPC) part") and a metal part 304 (e.g., a metal plate) enveloped at least partially by, and coupled with (such as generally adhered to, thermally press-bonded to, and the like), the FCA 302, thereby forming a connector assembly comprising first pads 303 on one side of the connector assembly electrically connected to second pads (not visible) on the opposing side of the connector assembly. The metal part 304 provides structural strength and rigidity to the feed-through 300, since the FCA 302 is flexible and relatively not rigid.

Figure 3B:
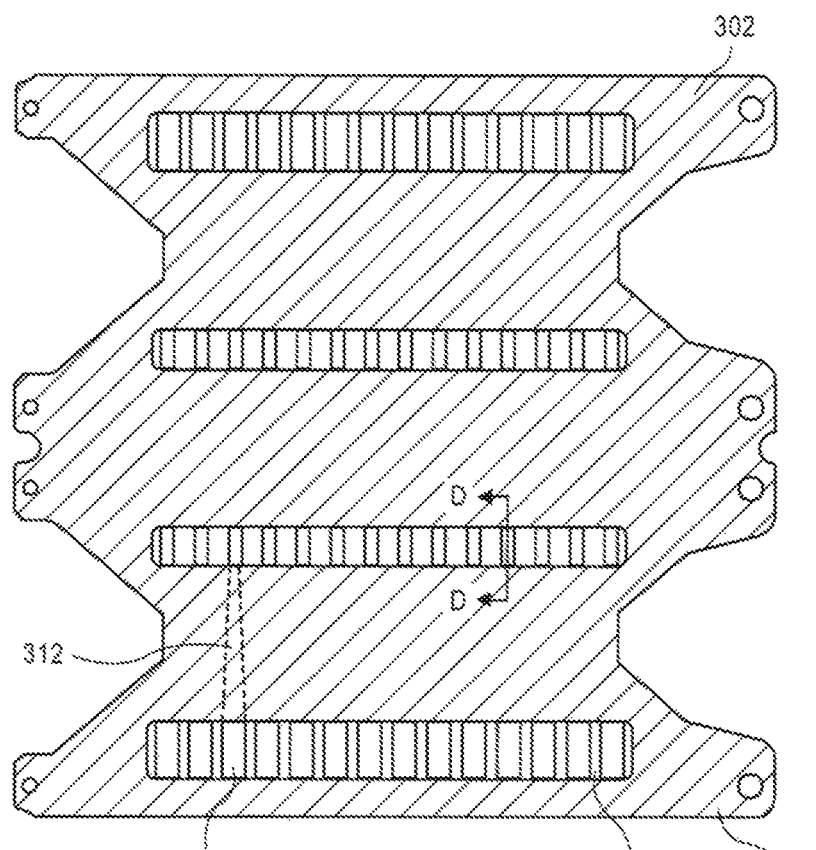
FIG. 3B is a plan view illustrating a flexible cable pattern for a flexible type electrical feed-through, according to an embodiment.
Figure 3C:
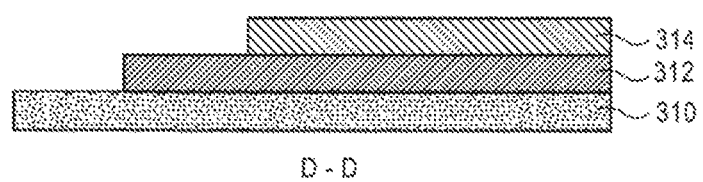
FIG. 3C is a cross-sectional side view illustrating a portion of the flexible cable pattern of FIG. 3B, according to an embodiment.

FIG. 3B is a plan view illustrating a flexible cable pattern for a flexible type electrical feed-through, and FIG. 3C is a cross-sectional side view (see cut A-A of FIG. 3B) illustrating a portion of the flexible cable pattern of FIG. 3B, according to an embodiment. The FCA 302 comprises a laminate structure (see FIG. 3C) comprising a base insulating layer 310 (for a non-limiting example, a polyimide material), a conductor layer 312 over the insulating layer 310, and a cover insulating layer 314 over the conductor layer 312, where the conductor layer 312 includes a plurality of electrical connection pads 303 and electrical conductors (such as copper electrical traces constituent to the conductor layer 312) connecting pairs of the pads, whereby the pads 303 of the conductor layer 312 are exposed by an opening(s) in the cover insulating layer 314. According to an embodiment, the base insulating layer 310 and/or the cover insulating layer 314 are constructed of a low permeability (e.g., to helium or other lighter-than-air gas) material, such as a polyimide material.

While terminology such as "top", "bottom", "over", "upper", "lower", and the like may be used herein to describe the feed-through 300 (and feed-through 700 of FIG. 7A), note that an electrical feed-through such as feed-through 300 (and feed-through 700) may not have a true top and a true bottom so terms such as those are used herein for purposes of reference and relative positioning rather than for a characterization of how feed-through 300 (and feed-through 700) may be manufactured or assembled or installed as a sub-component of a larger, higher-level component.

According to an embodiment, the FCA 302 is patterned or shaped (see FIG. 3B for an example) such that, when enveloping the metal part 304, one or more portions 305 (FIG. 3A; 4 areas depicted) of the metal part 304 are not covered by the FCA 302 and are thereby exposed. With reference to FIG. 3A, an adhesive 306 (for a non-limiting example, a pre-formed applicable epoxy) may be utilized to install the feed-through 300 to a metal portion of an enclosure base (e.g., of a sealed hard disk drive), where the adhesive 306 overlaps with portions of the FCA 302 and, notably, the one or more portions 305 of the metal part 304. Hence, the exposed one or more portions 305 of the metal part 304 of the feed-through 300 can directly interface with or mate with the metal portion of the base (e.g., an aluminum alloy), with the adhesive 306 interposed therebetween, thereby forming a hermetic seal between the feed-through 300 and the enclosure base, as described in more detail elsewhere herein. According to an embodiment, with the adhesive 306 overlapping with portions of the FCA 302, the adhesive 306 further bonds the portion of the FCA 320 to the metal base. According to an embodiment, a low permeability epoxy adhesive such as an alumina-filled epoxy is considered suitable for achieving a low leak rate through the adhesive 306.

Figure 4A:
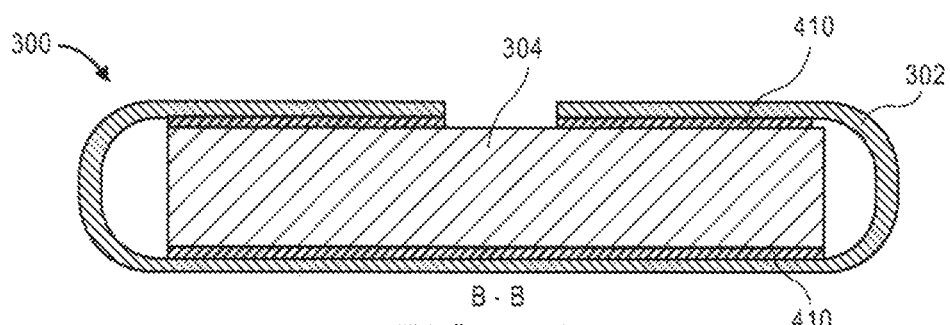
FIG. 4A is a cross-sectional side view illustrating the flexible type electrical feed-through of FIG. 3A, according to an embodiment.
Figure 4B:
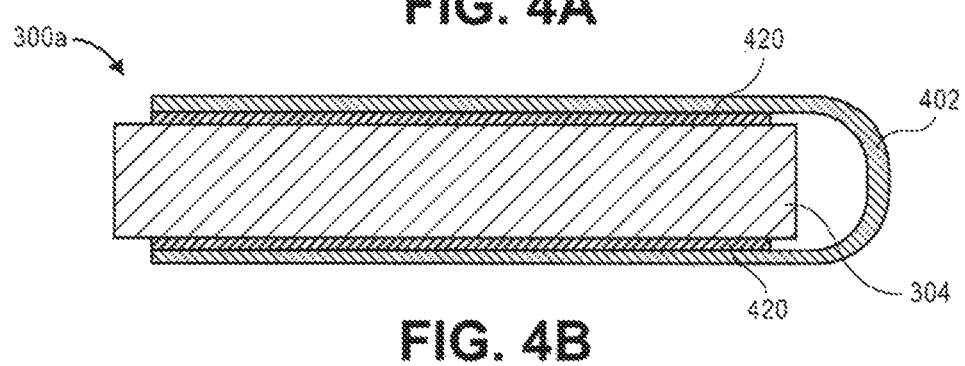
FIG. 4B is a cross-sectional side view illustrating a flexible type electrical feed-through, according to another embodiment.

FIG. 4A is a cross-sectional side view (see cut B-B of FIG. 3A) illustrating the flexible type electrical feed-through assembly of FIG. 3A, according to an embodiment. FIG. 4A illustrates and reiterates that the feed-through 300 comprises the FCA 302 (with the layers 310-314 of FIG. 3C not demarcated here) wrapped around the metal part 304, with the two parts coupled together with an adhesive 410 such as an adhesive film. FIG. 4B is a cross-sectional side view illustrating a flexible type electrical feed-through, according to an alternative embodiment. FIG. 4B illustrates that with an alternative embodiment a feed-through 300*a* may comprise an FCA 402, constructed similarly as FCA 302 (with the layers 310-314 of FIG. 3C) alternatively wrapped around the metal part 304, with the two parts coupled together with an adhesive 420 such as an adhesive film. According to an embodiment, a low permeability epoxy adhesive such as an alumina-filled epoxy is considered suitable for achieving a low leak rate through the adhesives 410, 420.

Flexible Type Electrical Feed-Through Installation Arrangement

Figure 5:
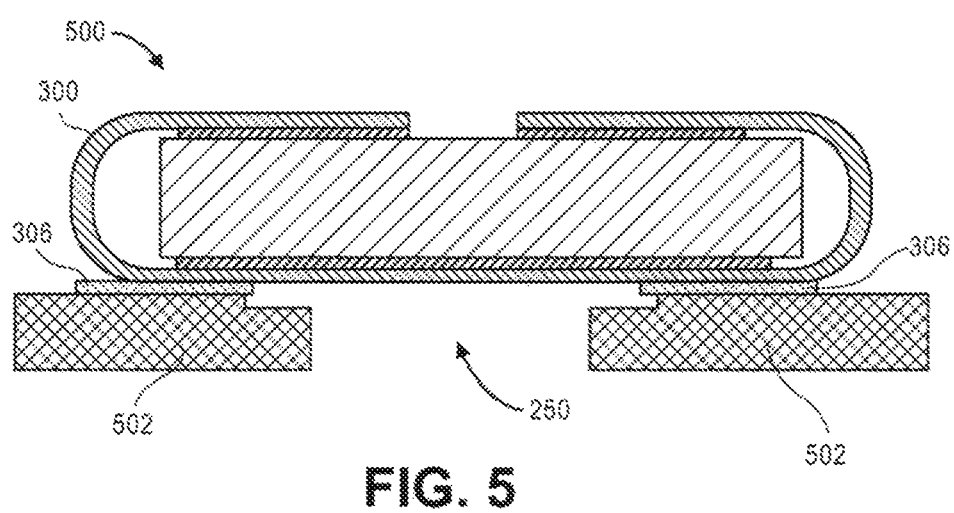
FIG. 5 is a cross-sectional side view illustrating a flexible type electrical feed-through of FIG. 3A installation arrangement, according to an embodiment.

FIG. 5 is a cross-sectional side view illustrating a flexible type electrical feed-through of FIG. 3A installation arrangement, according to an embodiment. Installation 500 comprises the feed-through 300 adhered to, bonded to, sealed with, at an interface 250 with an enclosure base 502 by adhesive 306.

Figure 6A:
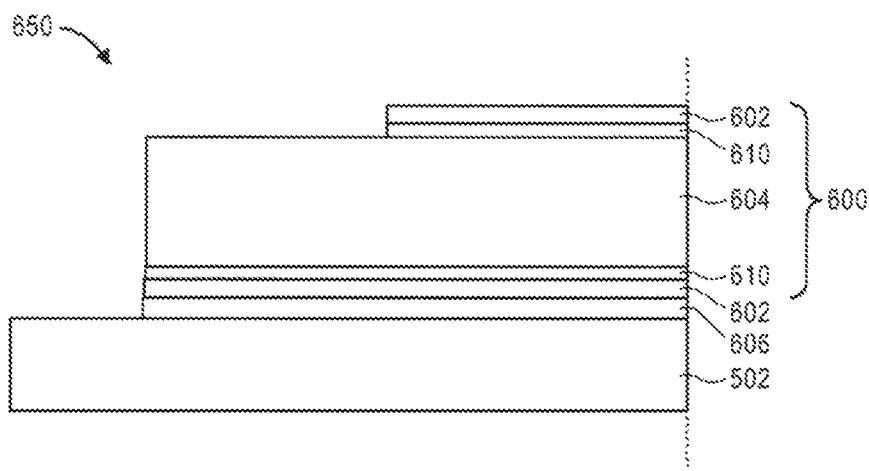
FIG. 6A is a cross-sectional side view illustrating a flexible type electrical feed-through installation arrangement, according to an embodiment.

FIG. 6A is a cross-sectional side view illustrating a flexible type electrical feed-through installation arrangement, according to an embodiment. Installation 650 comprises a feed-through 600 that differs from feed-through 300 (FIG. 3A) in that a metal part 604 is not exposed directly to the enclosure base 502 and an interposed adhesive 606, like the one or more portions 305 of the metal part 304 of feed-through 300 are exposed to adhesive 306 due to the shape of the FCA 302 (FIG. 3B). Thus, the adhesive 606 adheres a flexible circuit assembly 602 to the base 502 rather than directly adhering the metal part 604 to the base 502.

Figure 6B:
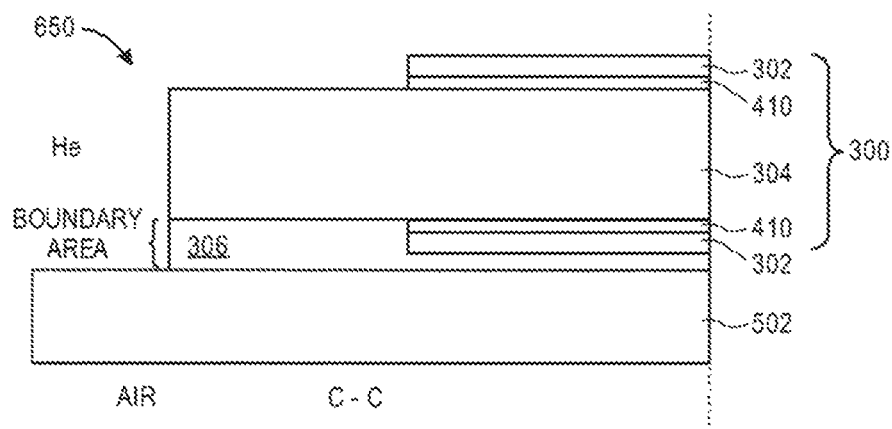
FIG. 6B is a cross-sectional side view illustrating a flexible type electrical feed-through installation arrangement, according to an embodiment.

FIG. 6B is a cross-sectional side view illustrating a flexible type electrical feed-through installation arrangement, according to an embodiment. Installation 660 comprises feed-through 300 comprising the metal part 304 exposed to the metal base 502 with the interposed adhesive 306, by way of the one or more portions 305 of the metal part 304, due to the shape of the FCA 302 (FIG. 3B). Therefore, the bonding force between the feed-through 300 and the metal base 502 is improved over the bonding force between the feed-through 600 and the metal base 502, by partially exposing the portions 305 of the metal part 304 inside the adhesive area (a lighter-than-air gas and adhesive "boundary area") to the metal base 502, thereby providing a metal-to-metal bond. Advantageously, a stronger seal at the boundary area may be expected using a high adhesive strength metal-to-metal bond.

Furthermore, greater sealing performance (e.g., hermetically sealing the internal lighter-than-air gas environment, such as within a helium-filled sealed HDD, from the external environment) may advantageously be provided. This is at least in part because an adhesive film such as adhesive 610 (FIG. 6A) (and adhesive 410 (FIG. 6B)), between the flexible circuit assembly 602 and the metal part 604, is conventionally a relatively more permeable material than polyimide and the adhesive 306 used in the boundary area to bond the feed-through 300 to the metal base 502 and, by implementation of the described "exposed metal" embodiments, the contact area of adhesive 410 is reduced (e.g., compare the relative length of adhesive 610 in FIG. 6A with the length of adhesive 410 in FIG. 6B). Experimentation has indicated the potential for a 7% reduction in the helium leakage rate between a feed-through installation such as installation 650 of FIG. 6A and a feed-through installation such as installation 660 of FIG. 6B, in which a feed-through such as feed-through 300 is implemented at the interface 250 (FIGS. 2, 5) of a hermetically-sealed internal environment and an external environment.

Flexible Type Electrical Feed-Through with Board-to-Board Connector

Figure 7A:
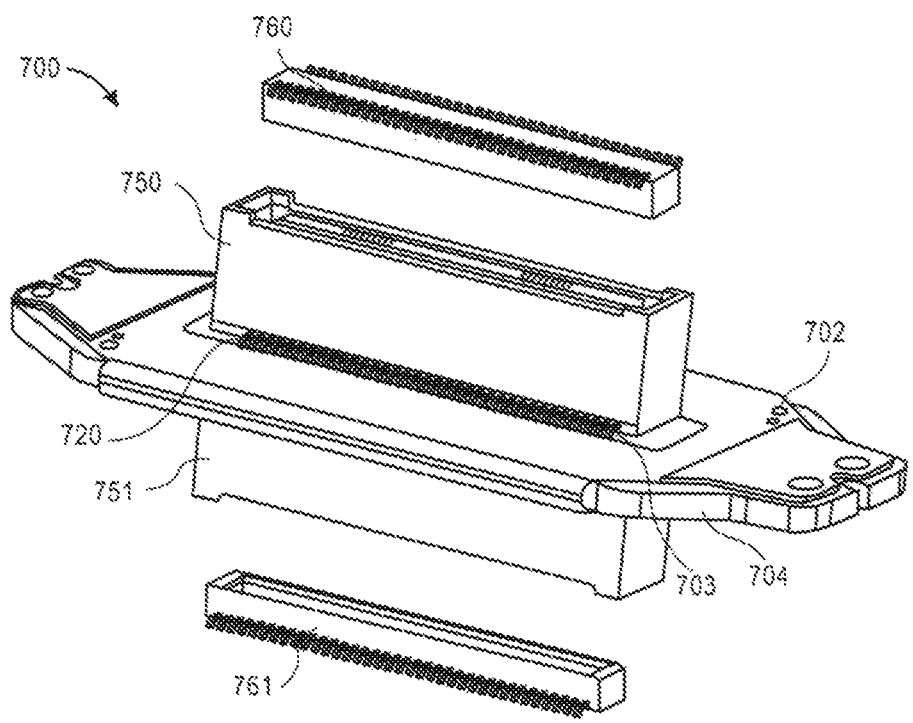
FIG. 7A is an exploded perspective view illustrating a board-to-board flexible type electrical feed-through/connector assembly, according to an embodiment.
Figure 7B:
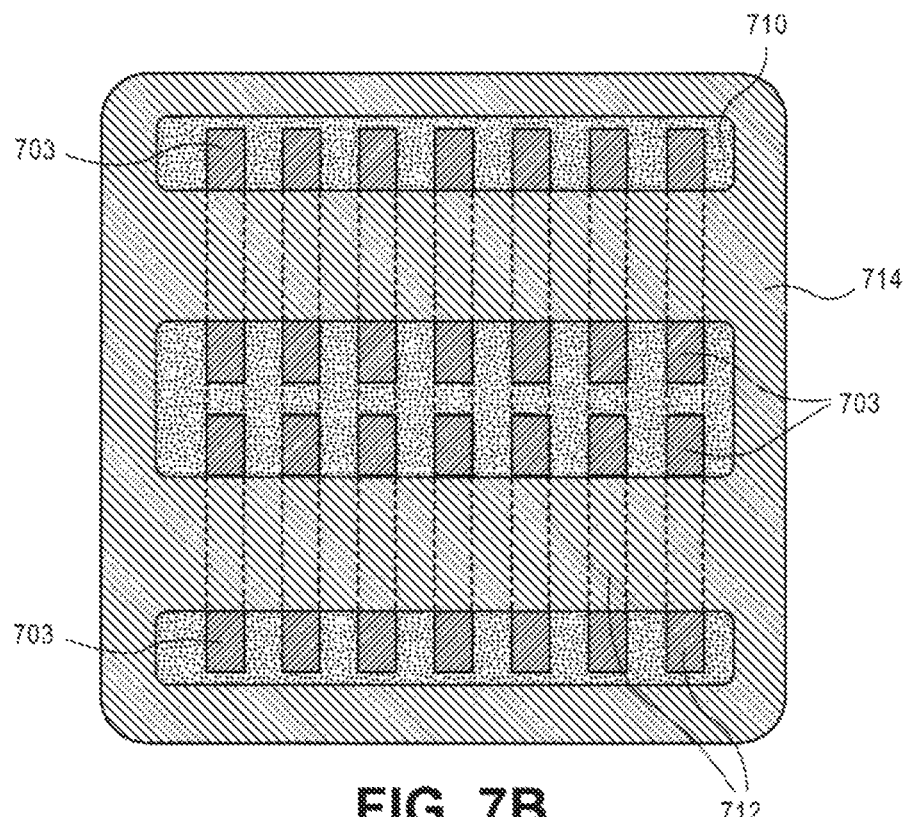
FIG. 7B is a top view illustrating a flexible cable pattern for the board-to-board flexible type electrical feed-through of FIG. 7A, according to an embodiment.

FIG. 7A is an exploded perspective view illustrating a board-to-board flexible type electrical feed-through/connector assembly, and FIG. 7B is a top view illustrating a flexible cable pattern for the board-to-board flexible type electrical feed-through of FIG. 7A, each according to an embodiment. Flexible type (or "flex-type") board-to-board (BTB) electrical feed-through assembly ("BTB feed-through assembly") 700 may be utilized as a sealed electrical connector, such as for providing electrical transmission through an interface of a sealed internal environment (such as within a hermetically-sealed electronic component, for a non-limiting example, a sealed hard disk drive data storage device) and an external (e.g., ambient) environment.

BTB feed-through assembly 700 comprises a flexible circuit assembly (FCA) 702 (or "a flexible printed circuit (FPC) part") and a metal part 704 (e.g., a metal plate) enveloped at least partially by, and coupled with (such as generally adhered to, thermally press-bonded to, and the like), the FCA 702, thereby forming a connector assembly comprising first pads 703 on one side of the connector assembly electrically connected to second pads (not visible) on the opposing side of the connector assembly. The FCA 702 comprises a similar cross-sectional construction as the FCA 302 (see, e.g., FIG. 3C), having a laminate structure comprising a base insulating layer 710 (for a non-limiting example, a polyimide material), a conductor layer 712 over the insulating layer 710, and a cover insulating layer 714 over the conductor layer 712, where the conductor layer 712 includes a plurality of electrical connection pads 703 and electrical conductors (such as copper electrical traces constituent to the conductor layer 712) connecting pairs of the pads, whereby the pads 703 of the conductor layer 712 are exposed by an opening(s) in the cover insulating layer 714, as depicted in FIG. 7B. According to an embodiment, the base insulating layer 710 and/or the cover insulating layer 714 are constructed of a low permeability (e.g., to helium or other lighter-than-air gas) material, such as a polyimide material.

BTB feed-through assembly 700 further comprises one or more board-to-board (BTB) connector receptacles electrically connected to the FCA 702. For example, BTB feed-through assembly 700 is depicted as comprising a first BTB connector receptacle 750 electrically connected to the FCA 702 on one side and a second BTB connector receptacle 751 electrically connected to the FCA 702 on the other opposing side. A board-to-board connector is typically used to connect printed circuit boards (PCBs) via a series of terminals or leads or pins, generally, "terminals 720". Here, such terminals 720 of each BTB connector receptacles, such as BTB connector receptacles 750 and 751, are electrically connected to corresponding pads 703 of the FCA 702 of feed-through assembly 700. Preferably, a narrow pin pitch BTB connector is used, which enables a smaller pad area for the pads 703 of the BTB feed-through assembly 700, for example in comparison with a pad area needed for a compression-type connector. Therefore, with smaller pads, electrical transmission performance can be improved by reducing the capacitance component of the BTB feed-through assembly 700. Furthermore, with a narrow pin pitch it is possible to increase the number of terminals without a larger outline size of the BTB feed-through assembly 700.

FIG. 7A further depicts an exploded view of a first mating BTB plug 760, which would be electrically connected to a separate component (e.g., a flexible cable assembly internal to a sealed electronic component, such as FCA 256 of FIG. 2), and which is configured to mate with and electrically connect to the corresponding BTB receptacle 750. Likewise, FIG. 7A further depicts an exploded view of a second mating BTB plug 761 (or header), which would be electrically connected to a separate component (e.g., a printed circuit board assembly (PCBA) external to the sealed electronic component, such as PCBA 950 of FIG. 9), and which is configured to mate with and electrically connect with the corresponding BTB receptacle 751. If the BTB feed-through assembly 700 were installed with an electronic component in an opposite position, then BTB plug 760 may be electrically connected to a PCBA while BTB plug 761 would be electrically connected to an FCA 256. According to an embodiment, the arrangement is reversed, whereby BTB connector plugs may be coupled to the FCA 702, with BTB connector receptacles coupled to the other connected components (e.g., a FCA and/or a PCBA).

Figure 8A:
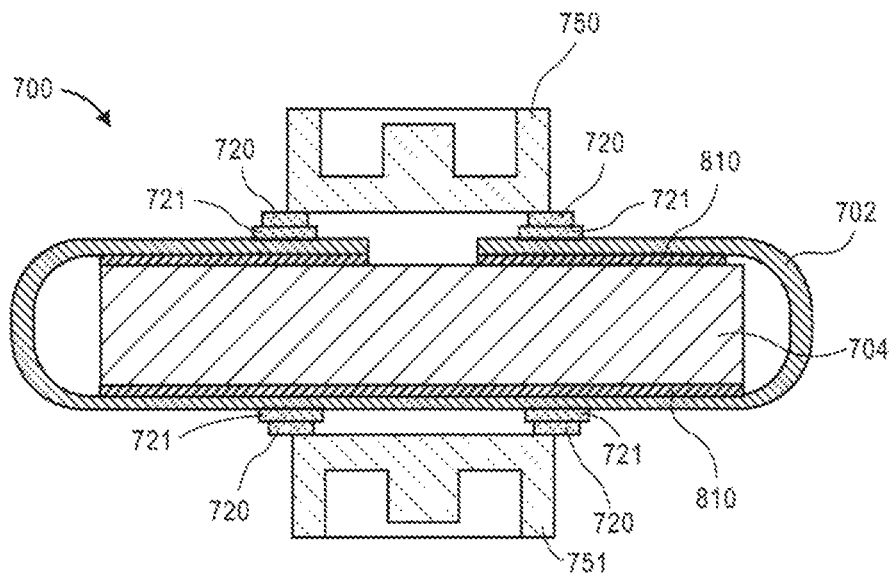
FIG. 8A is a cross-sectional side view illustrating the board-to-board flexible type electrical feed-through/connector assembly of FIG. 7A, according to an embodiment.
Figure 8B:
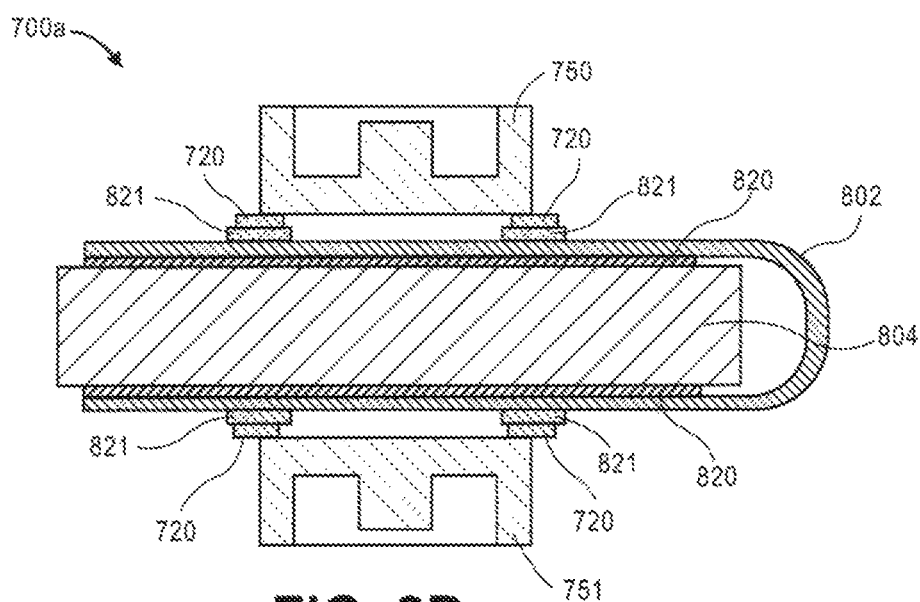
FIG. 8B is a cross-sectional side view illustrating a board-to-board flexible type electrical feed-through/connector assembly, according to another embodiment.

FIG. 8A is a cross-sectional side view illustrating the board-to-board flexible type electrical feed-through/connector assembly of FIG. 7A, according to an embodiment. FIG. 8A illustrates and reiterates that the BTB feed-through assembly 700 comprises the FCA 702 (with the layers 710-714 not demarcated here) wrapped around the metal part 704, with the two parts coupled together with an adhesive 810 such as an adhesive film. FIG. 8A further illustrates each BTB connector receptacle 750, 751 electrically connected to the FCA 702 by way of the terminals 720 or leads of the BTB connector receptacle 750, 751 and the pads 703 (FIG. 7A) of the FCA 702, such as with solder 721, for a non-limiting example. FIG. 8B is a cross-sectional side view illustrating a board-to-board flexible type electrical feed-through/connector assembly, according to another embodiment. FIG. 8B illustrates that with an alternative embodiment a BTB feed-through assembly 700a comprises an FCA 802 (with similar layers 710-714, not shown here) wrapped around the metal part 804, with the two parts coupled together with an adhesive 820 such as an adhesive film. FIG. 8B further illustrates each BTB connector receptacle 750, 751 electrically connected to the FCA 802 by way of the terminals 720 or leads of the BTB connector receptacle 750, 751 and the pads similar to pads 703 (FIG. 7A) of the FCA 802, such as with solder 821, for a non-limiting example.

Figure 9:
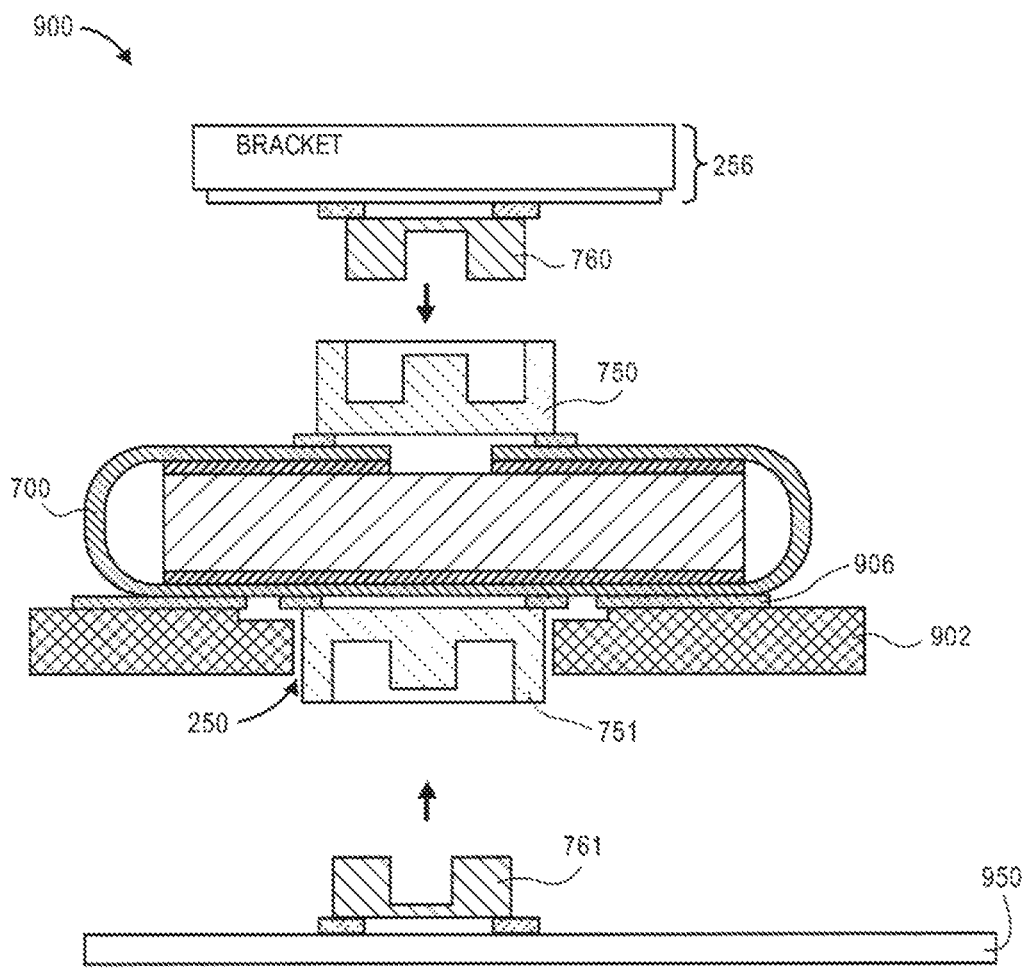
FIG. 9 is a cross-sectional side view illustrating the board-to-board flexible type electrical feed-through of FIG. 7A installation arrangement, according to an embodiment.

Flexible Type Electrical Feed-Through with Board-to-Board Connector Installation Arrangement FIG. 9 is a cross-sectional side view illustrating the board-to-board flexible type electrical feed-through of FIG. 7A installation arrangement, according to an embodiment. Installation 900 comprises the BTB feed-through assembly 700 adhered to, bonded to, sealed with, at an interface 250 with an enclosure base 902 by adhesive 906. FIG. 9 further illustrates a BTB connector plug 760 coupled to an FCA such as FCA 256 to form a higher-level component, intended for mechanically mating with and electrically connecting to the BTB connector receptacle 750 of BTB feed-through assembly 700 and, similarly, a BTB connector plug 761 coupled to a PCB 950 to form a higher-level PCBA component, intended for mechanically mating with and electrically connecting to the BTB connector receptacle 751 of BTB feed-through assembly 700. According to an embodiment, a low permeability epoxy adhesive such as an alumina-filled epoxy is considered suitable for achieving a low leak rate through the adhesive 906. Note that the base 902 window through which the BTB receptacle 751 extends at interface 250 can serve as a guide hole to align the BTB feed-through assembly 700. Furthermore, the stepped structural configuration of the base 902 around the window through which the BTB receptacle 751 extends at interface 250 functions to inhibit or prevent an electrical short among the BTB connector receptacle 751 and the adhesive 906, in the scenario in which an electrically conductive adhesive is used. Also notable is that the BTB connector receptacle housing may be fabricated with a low permeability (e.g., to He or other lighter-than-air gas) material.

Figure 10:
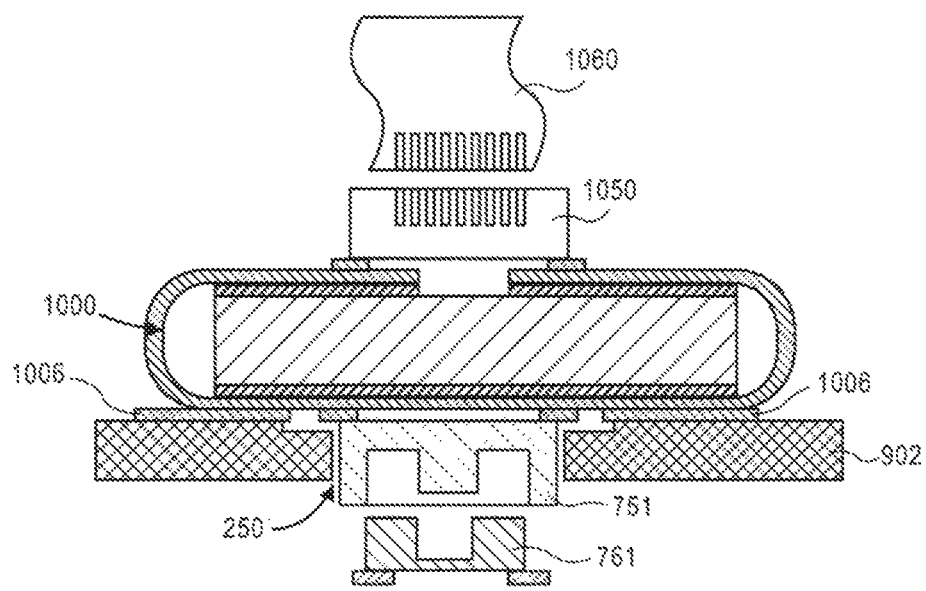
FIG. 10 is a cross-sectional side view illustrating a board-to-board flexible type electrical feed-through installation arrangement, according to an embodiment.

FIG. 10 is a cross-sectional side view illustrating a board-to-board flexible type electrical feed-through installation arrangement, according to an embodiment. The alternative installation of FIG. 10 comprises a BTB feed-through assembly 1000 adhered to, bonded to, sealed with, at an interface 250 with an enclosure base 902 by adhesive 1006, where BTB feed-through assembly 1000 is constructed and configured similarly to BTB feed-through assembly 700 (FIGS. 7A, 8A) except for the differences described immediately hereafter. FIG. 10 further illustrates a BTB connector plug 761 for coupling to a PCB such as PCB 950 (FIG. 9) to form a higher-level PCBA component (as previously described), intended for mechanically mating with and electrically connecting to the BTB connector receptacle 751 of BTB feed-through assembly 1000. Instead of utilizing a plug such as a BTB connector plug 760 for coupling to an FCA such as FCA 256 (FIG. 2) to form a higher-level component, this installation utilizes a board-to-flex (BTF) connector (otherwise referred to as a "ribbon cable connector") for electrically connecting a BTF connector receptacle 1050 of BTB feed-through assembly 1000 with a BTF connecter flex 1051, such as at a terminal end of an FCA 1060. Both board-to-board connectors and board-to-flex connectors may be referred to generally herein as board-to-component connectors.

Figure 11:
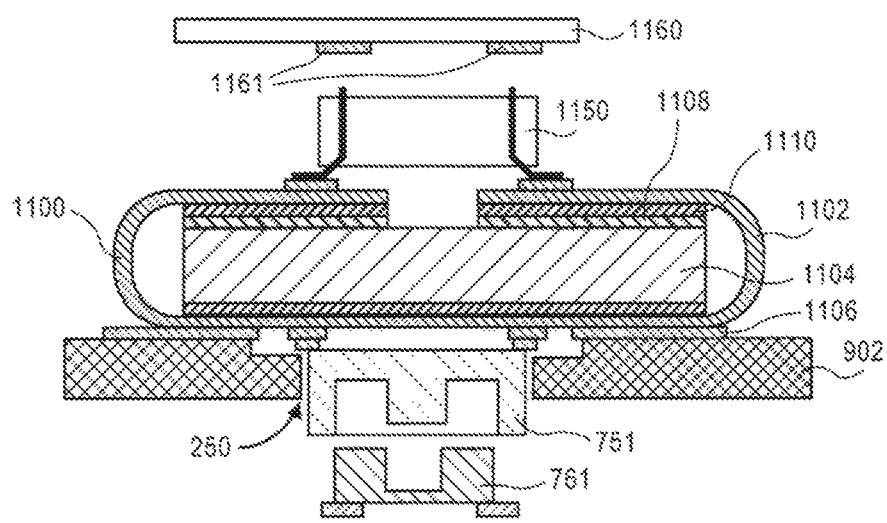
FIG. 11 is a cross-sectional side view illustrating a board-to-board flexible type electrical feed-through installation arrangement, according to another embodiment.

FIG. 11 is a cross-sectional side view illustrating a board-to-board flexible type electrical feed-through installation arrangement, according to another embodiment. The alternative installation of FIG. 11 comprises a BTB feed-through assembly 1100 adhered to, bonded to, sealed with, at an interface 250 with an enclosure base 902 by adhesive 1106. FIG. 11 further illustrates a BTB connector plug 761 for coupling to a PCB such as PCB 950 (FIG. 9) to form a higher-level PCBA component (as previously described), intended for mechanically mating with and electrically connecting to the BTB connector receptacle 751 of BTB feed-through assembly 1100. Instead of utilizing a plug such as a BTB connector plug 760 for coupling to an FCA such as FCA 256 (FIG. 2) to form a higher-level component, this installation utilizes a compression-type connector 1150 for electrically connecting BTB feed-through assembly 1100 with electrical connection pads 1161 at the terminal end of an FCA 1160. A compression-type connector has spring terminals (also referred to as "compression-type terminals"

or "compression-type pins", or at times referred to in the art as a "P2 connector"), which is a style of connector that can be used to electrically connect to and communicate with a PCB, for example.

As previously mentioned, using a compression-type connector may have a detrimental effect on electrical transmission performance because of the larger electrical connection pads needed. Thus, the installation of FIG. 11 includes a polyimide stiffener or resin bracket, generally, insulator 1108, between the FCA 1102 and the metal part 1104 of BTB feed-through assembly 1100, to increase the insulating distance from the conductors layer within the FCA 1102 to the metal part 1104 and, consequently, to improve electrical transmission performance characteristics. However, a compression-type connector is not ideal for use on the interface 250 side of the BTB feed-through assembly 1100, as the insulator 1108 may increase the leak rate through the installation.

Reiterating, one possible implementation of a low permeability electrical feed-through such as the various feed-through connectors described herein (e.g., feed-through 300, 300a; BTB feed-through assembly 700, 700a, 1000, 1000) may be for use with a sealed hard disk drive that includes a hermetically sealed gas-filled (e.g., a lighter-than-air type gas, such as helium, nitrogen, etc., for non-limiting examples) enclosure that has an opening extending through an HDD base (e.g., similar to a hermetically-sealed version of housing 168 of FIG. 1). In such an implementation, an electrical connector may be disposed inside the enclosure and adjacent to the opening, and which can be electrically connected to a low permeability electrical feed-through which spans the opening. For example, an electrical connector may be electrically connected with an internal HDD flexible interconnect cable (e.g., flex cable 156 of FIG. 1), and with the feed-through by way of electrical connection pads. Similarly, an electrical connector may be electrically connected to an external HDD PCB (i.e., attached to the HDD) and with the feed-through by way of electrical connection pads. Broadly, the described feed-through connectors may serve the purpose of facilitating electrical contact and connection between the outside and the inside of the hermetically sealed cavity/enclosure.

Method of Manufacturing an Electrical Feed-Through

FIG. 12 is a flow diagram illustrating a method of manufacturing an electrical feed-through component, according to an embodiment.

At block 1202, a laminate flexible cable assembly (FCA) is formed, comprising a base insulating layer, a conductor layer over the insulating layer, and a cover insulating layer over the conductor layer, wherein the conductor layer comprises a plurality of electrical connection pads and electrical conductors connecting pairs of the pads. For example, form an FCA such as FCA 302 (FIGS. 3B, 3C), 402 (FIG. 4B), 702 (FIG. 7B), 802 (FIG. 8B), 1102 (FIG. 11).

At block 1204, the FCA is folded at least in part around a metal plate. For example, fold FCA 302 around metal part 304 (FIGS. 3A, 4A, 4B), or fold FCA 702 around metal part 704 (FIGS. 7A, 8A), or fold FCA 802 around metal part 804 (FIG. 8B), or fold FCA 1102 around metal part 1104 (FIG. 11).

At block 1206, the FCA is adhered to the metal plate, forming a connector assembly comprising first pads of the pairs on an upper side of the connector assembly electrically connected via the conductors to second pads of the pairs on the lower side of the connector assembly. For example, FCA 302 is adhered to metal part 304 with adhesive 410 (FIG. 4A), or FCA 402 is adhered to metal part 404 with adhesive 420 (FIG. 4B), or FCA 702 is adhered to metal part 704 with adhesive 810 (FIG. 8A), or FCA 802 is adhered to metal part 804 with adhesive 820 (FIG. 8B), or FCA 1102 is adhered to metal part 1104 with adhesive 1110 (FIG. 4A).

Method of Sealing a Hermetic Interface

FIG. 13 is a flow diagram illustrating a method of sealing an interface between a hermetically-sealed internal environment and an external environment, according to an embodiment. At block 1302, provide electrical transmission means for transmitting electrical signals through the interface. At block 1304, provide means for mating a metal portion of the electrical transmission means with a metal portion of a base of the electronic component. At block 1306, provide hermetically-sealing means for bonding the metal portion of the electrical transmission means with the metal portion of the base.

Misalignment-Tolerant Sealed Electrical Feed-Through Connector Assembly

Figure 14:
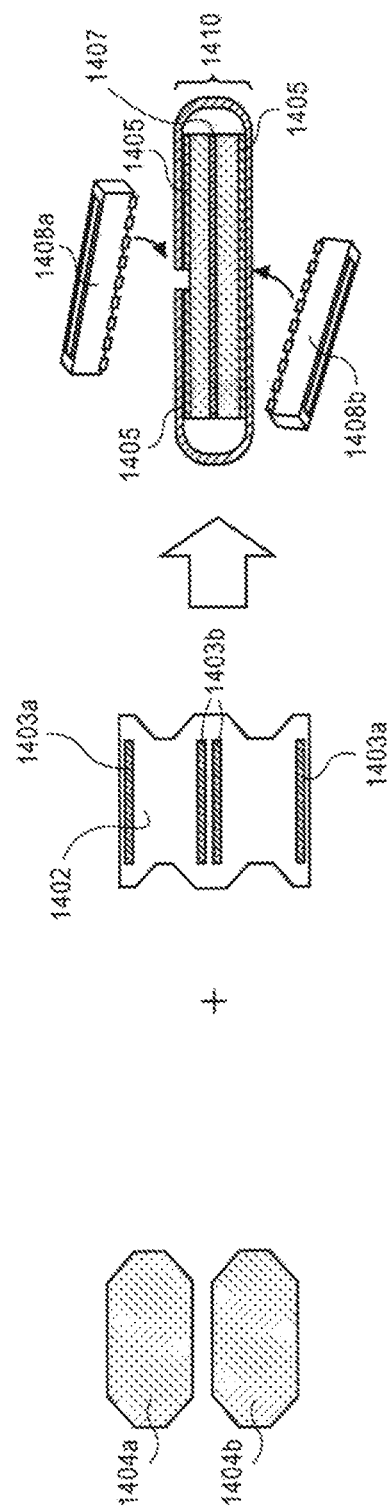
FIG. 14 is a diagram illustrating the component parts of a misalignment-tolerant flexible type electrical feed-through connector assembly, according to an embodiment.

FIG. 14 is a diagram illustrating the component parts of a misalignment-tolerant flexible type electrical feed-through connector assembly, according to an embodiment. A misalignment-tolerant flexible type electrical feed-through connector assembly 1400 ("flexible feed-through connector assembly 1400", e.g., in its capability to be "flexible" to misalignment) may be implemented for interfacing between a hermetically-sealed environment, such as within the hermetically-sealed internal environment of HDD 200 (FIG. 2) and an external environment (e.g., ambient). That is, flexible feed-through connector assembly 1400 may be utilized as a sealed electrical connector. The misalignment-tolerant flexible type electrical feed-through connector assembly 1400 comprises a plurality of metal parts 1404a, 1404b (a quantity of two illustrated here, for purposes of a non-limiting example, as the number of metal parts may vary from implementation to implementation) and a flexible circuit assembly 1402 ("FCA 1402") that is wrapped around the metal parts 1404a, 1404b to form an electrical feed-through assembly 1410, to which at least one electrical connector 1408a, 1408b (illustrated in exploded view form) is electrically connected. Alternatively, either or any of the parts 1404a, 1404b that is not positioned on the sealing side of the flexible feed-through connector assembly 1400 (such as part 1404b of FIGS. 15A, 15B), may be composed of a relatively rigid material besides metal, such as a low permeability (e.g., to helium or other lighter-than-air gas) polymer material. At least two of the plurality of metal parts 1404a, 1404b are adhered to the FCA 1402, such as with an adhesive 1405.

According to an embodiment, the FCA 1402 is constructed the same as or similarly to the FCA 302 (FIG. 3C). That is, the FCA 1402 may comprise a laminate structure (see FIG. 3C) comprising a base insulating layer 310 (for a non-limiting example, a polyimide material), a conductor layer 312 over the insulating layer 310, and a cover insulating layer 314 over the conductor layer 312, where the conductor layer 312 includes a plurality of electrical connection pads 303 and electrical conductors (such as copper electrical traces constituent to the conductor layer 312) connecting pairs of the pads, whereby the pads 303 of the conductor layer 312 are exposed by an opening(s) in the cover insulating layer 314. According to an embodiment, the base insulating layer 310 and/or the cover insulating layer 314 are constructed of a low permeability (e.g., to helium or other lighter-than-air gas) material, such as a polyimide material. The shape of the FCA 1402 illustrated in FIG. 14 is for purposes of a non-limiting example, as the shape of the FCA 1402 may vary from implementation to implementation.

According to an embodiment, one or more of the metal parts 1404a, 1404b (which may be the same as or similar to metal part 304 of FIG. 3) is constructed of a metal plate. While each metal part 1404a, 1404b is illustrated in FIG. 14 as being the same size and shape, the shape and dimensions of each of the plurality of metal parts 1404a, 1404b, etc., may vary from implementation to implementation, and need not be identical as illustrated. In the formed electrical feed-through assembly 1410, the plurality of metal parts 1404a, 1404b are adjacent and, according to one embodiment, metal parts 1404a, 1404b are stacked relative to one another, as illustrated.

According to an embodiment, flexible feed-through connector assembly 1400 further comprises a board-to-board (BTB) electrical connector part (e.g., a connector receptacle and/or a connector plug or header), such as electrical connector part 1408a and/or electrical connector part 1408b, electrically connected to at least one of the first pads and the second pads. For example and according to an embodiment, a first BTB electrical connector part 1408b (e.g., a connector receptacle) is electrically connected to the second pads (e.g., bottom side), which is in turn electrically connected to a mating BTB electrical connector part (e.g., a connector plug or header) coupled with an external printed circuit board assembly (PCBA) of a data storage device such as a hard disk drive (HDD). Furthermore or alternatively, and according to an embodiment, a second BTB electrical connector part 1408a (e.g., a connector receptacle) is electrically connected to the first pads (e.g., top side), which is in turn electrically connected to a mating BTB electrical connector part (e.g., a connector plug or header) coupled with an internal flexible cable assembly (FCA) of a data storage device such as a hard disk drive (HDD). According to an embodiment, the second BTB electrical connector part 1408a and its mating connector part of the FCA may be implemented with board-to-flex (BTF) connector parts rather than BTB connector parts.

Notably, the metal parts 1404a, 1404b are not bonded together. Rather, according to an embodiment, flexible feed-through connector assembly 1400 further comprises a friction-inhibiting, anti-sticking material 1407 ("friction-inhibiting material 1407") positioned at the interface between a pair (or each pair) of adjacent metal parts such as the plurality of adjacent metal parts 1404a, 1404b, to promote the movement/sliding of the adjacent metal parts 1404a, 1404b relative to each other to "absorb" or tolerate any misalignment between or among other parts, such as mechanical or physical misalignment between connector part 1408a and connector part 1408b (see, e.g., FIG. 15B). The friction-inhibiting material that may be used as friction-inhibiting material 1407 may vary from implementation to implementation. According to one embodiment, a friction-inhibiting coating is used as the friction-inhibiting material 1407 to coat at least one side of at least one of the metal parts 1404a, 1404b of the pair. According to another embodiment, a friction-inhibiting tape is used as the friction-inhibiting material 1407 between the metal parts 1404a, 1404b of the pair. For non-limiting examples, and according to embodiments, the friction-inhibiting material 1407 may comprise a fluorine coating or a fluorine resin tape such as PTFE (polytetraflouroethylene) tape, or a ultrahigh molecular weight polyethylene film, or a Kapton tape (i.e., Dupont™ Kapton®).

Figure 15A:
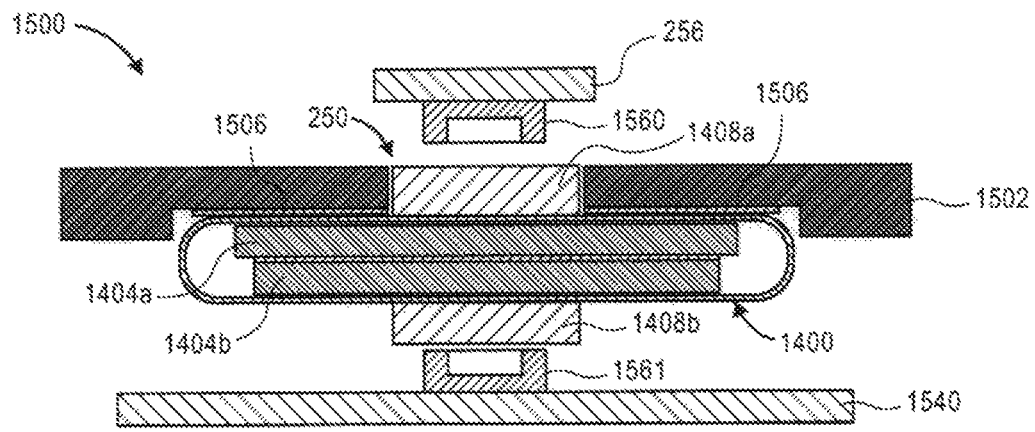
FIG. 15A is a cross-sectional side view illustrating a misalignment-tolerant flexible type electrical feed-through installation arrangement, according to an embodiment.

Misalignment-Tolerant Sealed Electrical Feed-Through Connector Assembly Installation Arrangement FIG. 15A is a cross-sectional side view illustrating a misalignment-tolerant flexible type electrical feed-through installation arrangement, according to an embodiment. Installation 1500 comprises the flexible feed-through connector assembly 1400 adhered to, bonded to, sealed with, at an interface 250 with an enclosure base 1502 by adhesive 1506. FIG. 15A further illustrates a connector part 1560 coupled to an FCA such as FCA 256 to form a higher-level component, intended for mechanically mating with and electrically connecting to the connector part 1408a of flexible feed-through connector assembly 1400 and, similarly, a connector part 1561 coupled to a PCB 1540 to form a higher-level PCBA component, intended for mechanically mating with and electrically connecting to the connector part 1408b of flexible feed-through connector assembly 1400. According to an embodiment, a low permeability epoxy adhesive such as an alumina-filled epoxy is considered suitable for achieving a low leak rate through the adhesive 1506. FIG. 15A illustrates an installation 1500 in which the respective connector parts are in a good alignment position and, therefore, the metal parts 1404a, 1404b (FIG. 14) are relatively centered with respect to each other.

Figure 15B:
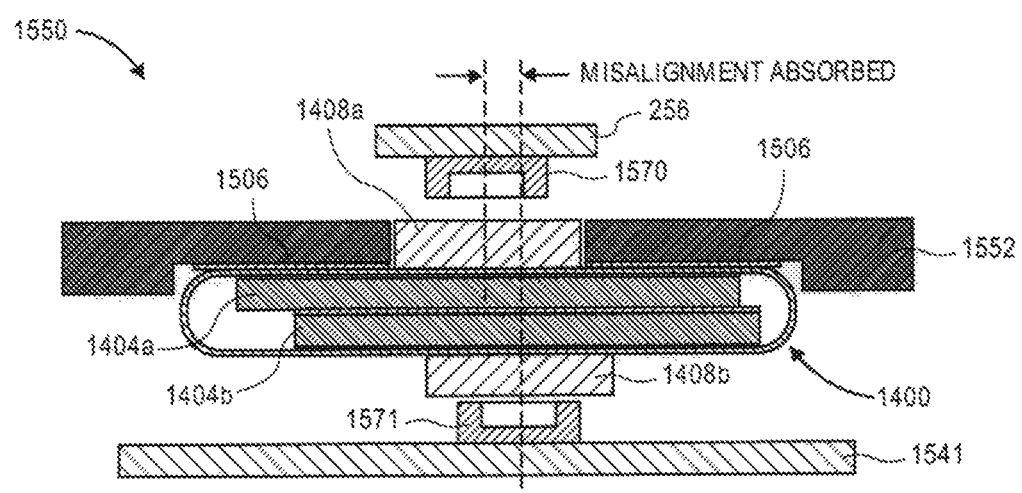
FIG. 15B is a cross-sectional side view illustrating a misalignment-tolerant flexible type electrical feed-through installation arrangement, according to an embodiment.

FIG. 15B is a cross-sectional side view illustrating a misalignment-tolerant flexible type electrical feed-through installation arrangement, according to an embodiment. Similarly to installation 1500 of FIG. 15A, installation 1550 comprises the flexible feed-through connector assembly 1400 adhered to, bonded to, sealed with an enclosure base 1552. FIG. 15B further illustrates a connector part 1570 coupled to an FCA such as FCA 256 to form a higher-level component, intended for mechanically mating with and electrically connecting to the connector part 1408a of flexible feed-through connector assembly 1400 and, similarly, a connector part 1571 coupled to a PCB 1541 to form a higher-level PCBA component, intended for mechanically mating with and electrically connecting to the connector part 1408b of flexible feed-through connector assembly 1400. FIG. 15B illustrates an installation 1550 in which the respective connector parts 1570 and 1571 are misaligned and, therefore, the metal parts 1404a, 1404b (FIG. 14) are not centered with respect to each other. However, because the metal parts 1404a and 1404b of flexible feed-through connector assembly 1400 are able to move, translate, slide relative to each other, the misalignment of connector parts 1570 and 1571 is effectively "absorbed" and the respective connector pairs 1408a-1570 and 1408b-1571 are mechanically mateable and electrically connectable. Thus, undesirable stresses are not as likely to be induced upon the connector pairs, and a highly reliable (e.g., mechanically, electrically, sealably) flexible feed-through connector assembly, at a relatively low cost, is provided. While FIGS. 15A, 15B illustrate the flexible feed-through connector assembly 1400 adhered to external surfaces of the base 1502, 1552, note that the flexible feed-through connector assembly 1400 may alternatively be adapted for adherence to the internal surfaces of the base 1502, 1552.

The method of manufacturing an electrical feed-through as described in reference to FIG. 12 may be adapted for use with a flexible feed-through connector assembly 1400 by, prior to block 1204, positioning an anti-sticking material at an interface between each pair of adjacent metal plates, and then at block 1206 adhering the FCA 1402 to each metal plate 1404a, 1404b, thereby forming a connector assembly comprising the first pads 1403a (FIG. 14) on the upper side of the connector assembly, electrically connected via the conductors to the second pads 1403b (FIG. 14) on the lower side of the connector assembly, and then electrically connecting a board-to-component connector part to at least one of the first pads 1403a and the second pads 1403b of the flexible feed-through connector assembly 1400.

The method of sealing a hermetic interface as described in reference to FIG. 13 may be adapted for use with a flexible feed-through connector assembly 1400 by providing misalignment tolerant electrical transmission means at block 1302, optionally eliminating block 1304, and prior to block 1306, providing first and second electrical connection means between respective portions of the electrical transmission means, located either in the hermetically-sealed environment or the external environment, and a component located in the respective environment.

Extensions and Alternatives

In the foregoing description, embodiments of the invention have been described with reference to numerous specific details that may vary from implementation to implementation. Therefore, various modifications and changes may be made thereto without departing from the broader spirit and scope of the embodiments. Thus, the sole and exclusive indicator of what is the invention, and is intended by the applicants to be the invention, is the set of claims that issue from this application, in the specific form in which such claims issue, including any subsequent correction. Any definitions expressly set forth herein for terms contained in such claims shall govern the meaning of such terms as used in the claims. Hence, no limitation, element, property, feature, advantage or attribute that is not expressly recited in a claim should limit the scope of such claim in any way. The specification and drawings are, accordingly, to be regarded in an illustrative rather than a restrictive sense.

In addition, in this description certain process steps may be set forth in a particular order, and alphabetic and alphanumeric labels may be used to identify certain steps. Unless specifically stated in the description, embodiments are not necessarily limited to any particular order of carrying out such steps. In particular, the labels are used merely for convenient identification of steps, and are not intended to specify or require a particular order of carrying out such steps.

What is claimed is:

1. A hermetically-sealed data storage device, comprising:
an enclosure base; and
an electrical feed-through connector assembly bonded to the base, the feed-through connector assembly comprising:
a flexible circuit assembly comprising a laminate of a base insulating layer, a conductor layer over the insulating layer, and a cover insulating layer over the conductor layer, wherein the conductor layer comprises a plurality of electrical connection pads and electrical conductors connecting pairs of the pads, and
a plurality of adjacent metal parts enveloped at least in part by, and at least two metal parts of the plurality of adjacent metal parts adhered to, the flexible circuit assembly, forming an electrical feed-through assembly comprising first pads of the pairs on one side of the feed-through assembly electrically connected via the conductors to second pads of the pairs on the opposing side of the feed-through assembly.

2. The data storage device of claim 1, wherein the electrical feed-through connector assembly further comprises:
a friction-inhibiting material positioned at an interface between a pair of adjacent metal parts of the plurality of adjacent metal parts.

3. The data storage device of claim 1, wherein the plurality of adjacent metal parts comprises only two metal parts.

4. The data storage device of claim 1, wherein the plurality of adjacent metal parts comprises more than two metal parts.

5. The data storage device of claim 1, wherein:
the electrical feed-through connector assembly further comprises a first board-to-board (BTB) connector receptacle electrically connected to the second pads;
the data storage device further comprises a printed circuit board assembly (PCBA) comprising a printed circuit board (PCB) and a first BTB connector plug coupled with the PCB; and
the PCBA is electrically connected to the electrical feed-through connector assembly via a mating of the first BTB connector plug and the first BTB connector receptacle.

6. The data storage device of claim 5, wherein:
the electrical feed-through connector assembly further comprises a second board-to-board (BTB) connector receptacle electrically connected to the first pads;
the data storage device further comprises a flexible cable assembly (FCA) coupled with a second BTB connector plug; and
the FCA is electrically connected to the feed-through connector assembly via a mating of the second BTB connector plug and the second BTB connector receptacle.

7. The data storage device of claim 1, wherein:
the electrical feed-through connector assembly further comprises a board-to-board (BTB) connector receptacle electrically connected to the first pads;
the data storage device further comprises a flexible cable assembly (FCA) coupled with a BTB connector plug; and
the FCA is electrically connected to the feed-through connector assembly via a mating of the BTB connector plug and the BTB connector receptacle.

8. The data storage device of claim 1, wherein:
the electrical feed-through connector assembly further comprises a first board-to-flex (BTF) connector part electrically connected to the first pads;
the data storage device further comprises a flexible cable assembly (FCA) coupled with a second BTF connector part; and
the FCA is electrically connected to the feed-through connector assembly via a mating of the first BTF connector part and the second BTF connector part.

9. An electrical feed-through connector assembly configured to interface between a hermetically-sealed environment and an external environment, the electrical feed-through connector assembly comprising:
a flexible circuit assembly comprising a laminate of a base insulating layer, a conductor layer over the insulating layer, and a cover insulating layer over the conductor layer, wherein the conductor layer comprises a plurality of electrical connection pads and electrical conductors connecting pairs of the pads, and a plurality of stacked metal parts enveloped at least in part by, and at least two of the plurality of stacked metal parts adhered to, the flexible circuit assembly, thereby forming an electrical feed-through assembly comprising first pads of the pairs on one side of the feed-through assembly electrically connected via the conductors to second pads of the pairs on the opposing side of the feed-through assembly.

10. The electrical feed-through connector assembly of claim 9, further comprising:
a friction-inhibiting material positioned at an interface between a pair of adjacent metal parts of the plurality of stacked metal parts.

11. The electrical feed-through connector assembly of claim 10, wherein the friction-inhibiting material comprises a material coating at least one side of at least one metal part of the pair.

12. The electrical feed-through connector assembly of claim 10, wherein the friction-inhibiting material comprises a tape material between the metal parts of the pair.

13. The electrical feed-through connector assembly of claim 9, wherein the plurality of stacked metal parts comprises only two metal parts.

14. The electrical feed-through connector assembly of claim 9, wherein the plurality of stacked metal parts comprises more than two metal parts.

15. The electrical feed-through connector assembly of claim 9, further comprising:
a board-to-board (BTB) connector part electrically connected to at least one of the first pads and the second pads.

16. The electrical feed-through connector assembly of claim 9, further comprising:
a first board-to-board (BTB) connector part electrically connected to the first pads; and
a second board-to-board (BTB) connector part electrically connected to the second pads.

17. A method of manufacturing an electrical feed-through component, the method comprising:
providing a laminate flexible cable assembly (FCA) comprising a base insulating layer, a conductor layer over the insulating layer, and a cover insulating layer over the conductor layer, wherein the conductor layer comprises a plurality of electrical connection pads and electrical conductors connecting pairs of the pads;
folding the FCA at least in part around a plurality of stacked metal plates; and
adhering the FCA to at least two metal plates of the plurality of stacked metal plates, thereby forming an electrical feed-through assembly comprising first pads of the pairs on an upper side of the feed-through assembly electrically connected via the conductors to second pads of the pairs on the lower side of the feed-through assembly.

18. The method of claim 17, further comprising:
positioning an anti-sticking material at an interface between a pair of adjacent metal plates of the plurality of stacked metal plates.

19. The method of claim 17, further comprising:
electrically connecting a board-to-board (BTB) connector part to at least one of the first pads and the second pads.

20. A method of sealing an electrical feed-through configured to interface between a hermetically-sealed environment and an external environment, the method comprising:
positioning an electrical feed-through to interface with an outer surface of a metal enclosure base, wherein the electrical feed-through comprises:
a flexible circuit assembly comprising a laminate of a base insulating layer, a conductor layer over the insulating layer, and a cover insulating layer over the conductor layer, wherein the conductor layer comprises a plurality of electrical connection pads and electrical conductors connecting pairs of the pads,
a plurality of metal parts enveloped at least in part by, and at least two of the plurality of metal parts adhered to, the flexible circuit assembly, thereby forming an electrical feed-through assembly comprising first pads of the pairs on one side of the feed-through assembly electrically connected via the conductors to second pads of the pairs on the opposing side of the feed-through assembly,
a board-to-board (BTB) connector part electrically connected to at least one of the first pads and the second pads, and
an antifriction material positioned at an interface between a pair of adjacent metal parts of the plurality of metal parts; and
adhesively bonding the electrical feed-through to the metal enclosure base.

21. A method of sealing an interface between a hermetically-sealed environment of an electronic component and an external environment, the method comprising:
providing misalignment-tolerant electrical transmission means for transmitting electrical signals through the interface;
providing first electrical connection means between a portion of the electrical transmission means located in the hermetically-sealed environment and a component located in the hermetically-sealed environment;
providing second electrical connection means between a portion of the electrical transmission means located in the external environment and a component located in the external environment; and
providing hermetically-sealing means for bonding the electrical transmission means with an enclosure base of the electronic component.

* * * * *